US012553845B2

(12) United States Patent
Abarra et al.

(10) Patent No.: US 12,553,845 B2
(45) Date of Patent: Feb. 17, 2026

(54) HOLDER TEMPERATURE DETECTION METHOD, HOLDER MONITORING METHOD AND SUBSTRATE PROCESSING APPARATUS

(71) Applicant: TOKYO ELECTRON LIMITED, Tokyo (JP)

(72) Inventors: Einstein Noel Abarra, Tokyo (JP); Hiroaki Chihaya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 746 days.

(21) Appl. No.: 17/575,018

(22) Filed: Jan. 13, 2022

(65) Prior Publication Data

US 2022/0236202 A1 Jul. 28, 2022

(30) Foreign Application Priority Data

Jan. 22, 2021 (JP) ................. 2021-008971

(51) Int. Cl.
| | | |
|---|---|---|
| *G01N 25/18* | (2006.01) | |
| *G01K 11/00* | (2006.01) | |
| *H01L 21/67* | (2006.01) | |

(52) U.S. Cl.
CPC ............. *G01N 25/18* (2013.01); *G01K 11/00* (2013.01); *H01L 21/67248* (2013.01)

(58) Field of Classification Search
CPC ........ G01N 25/18; G01K 11/00; G01K 11/20; G01K 13/08; G01K 11/32; H01L 21/67248; H01L 21/67103; H01L 21/67109; H01L 21/68792; C23C 14/505; C23C 14/52; C23C 14/54; C23C 14/541; G01J 3/4406; G02B 6/02204

USPC ............................................................ 374/44
See application file for complete search history.

(56) References Cited

U.S. PATENT DOCUMENTS

| | | | |
|---|---|---|---|
| 6,891,627 B1 * | 5/2005 | Levy ...................... | G01N 21/64 356/636 |
| 7,560,007 B2 | 7/2009 | Gaff | |
| 8,012,304 B2 | 9/2011 | Brillhart et al. | |
| 8,021,521 B2 | 9/2011 | Buchberger, Jr. et al. | |
| 8,092,639 B2 | 1/2012 | Buchberger et al. | |
| 8,221,580 B2 | 7/2012 | Buchberger, Jr. et al. | |
| 8,329,586 B2 | 12/2012 | Buchberger, Jr. et al. | |
| 8,546,267 B2 | 10/2013 | Brillhart et al. | |
| 8,608,900 B2 | 12/2013 | Buchberger, Jr. et al. | |
| 8,980,044 B2 | 3/2015 | Brillhart et al. | |

(Continued)

FOREIGN PATENT DOCUMENTS

| | | | |
|---|---|---|---|
| JP | 2000055747 A | * | 2/2000 |
| JP | 2000-223435 A | | 8/2000 |

(Continued)

*Primary Examiner* — Paul M. West
*Assistant Examiner* — Evan Mancini
(74) *Attorney, Agent, or Firm* — Fenwick & West LLP (57) ABSTRACT

A holder temperature detection method which measures a temperature of a rotatable holder that holds a substrate is provided. The method comprises a step of irradiating a fluorescent body thermally mounted on the holder with a light pulse having a first wavelength, a step of detecting fluorescence having a second wavelength emitted from the fluorescent body due to the light pulse and a step of estimating the temperature of the holder based on the detected fluorescence.

9 Claims, 8 Drawing Sheets

(56) References Cited

U.S. PATENT DOCUMENTS

| | | |
|---|---|---|
| 11,718,917 B2 * | 8/2023 | Fouliard ............... C23C 14/083 427/454 |
| 2007/0089834 A1 | 4/2007 | Brillhart et al. |
| 2007/0091537 A1 | 4/2007 | Buchberger et al. |
| 2007/0091538 A1 | 4/2007 | Buchberger et al. |
| 2007/0091539 A1 | 4/2007 | Buchberger et al. |
| 2007/0091540 A1 | 4/2007 | Brillhart et al. |
| 2007/0091541 A1 | 4/2007 | Buchberger et al. |
| 2008/0064126 A1 | 3/2008 | Gaff |
| 2010/0124248 A1 * | 5/2010 | Patalay ............ H01L 21/67248 374/121 |
| 2010/0314046 A1 | 12/2010 | Brillhart et al. |
| 2010/0319851 A1 | 12/2010 | Buchberger, Jr. et al. |
| 2011/0065279 A1 | 3/2011 | Buchberger, Jr. et al. |
| 2011/0068085 A1 | 3/2011 | Brillhart et al. |
| 2015/0201469 A1 | 7/2015 | Shimomura |
| 2016/0356717 A1 * | 12/2016 | Fujii ................ G01N 33/54373 |
| 2018/0195961 A1 * | 7/2018 | Earney ................. G01J 3/4406 |
| 2020/0388517 A1 * | 12/2020 | Rohrmann ........ H01L 21/67109 |
| 2021/0134627 A1 * | 5/2021 | Peng ....................... H01L 22/30 |
| 2021/0172806 A1 * | 6/2021 | Jupudi ................... G01K 13/00 |

FOREIGN PATENT DOCUMENTS

| | | | |
|---|---|---|---|
| JP | 2007-116098 A | 5/2007 | |
| JP | 2010-503231 A | 1/2010 | |
| JP | 2015-135250 A | 7/2015 | |
| JP | 2018-178163 A | 11/2018 | |
| WO | WO-2008033234 A2 * | 3/2008 | ............ G01K 11/20 |

* cited by examiner

HOLDER TEMPERATURE DETECTION METHOD, HOLDER MONITORING METHOD AND SUBSTRATE PROCESSING APPARATUS

CROSS-REFERENCE TO RELATED APPLICATIONS

This application claims priority to Japanese Patent Application No. 2021-008971 filed on Jan. 22, 2021, the entire contents of which are incorporated herein by reference.

TECHNICAL FIELD

The present disclosure relates to a holder temperature detection method, a holder monitoring method, and a substrate processing apparatus.

BACKGROUND

A substrate processing apparatus having a rotatable holder for holding a substrate is known. —Japanese Laid-open Patent Publication No. 2018-178163 discloses a movable body structure which includes a processing container configured to enable processing in a vacuum environment, a fixed part disposed in the processing container, a movable part provided to be movable with respect to the fixed part, a transmission and reception module provided in the fixed part and having an airtight seal structure, and a sensor module provided in the movable part and having an airtight seal structure, wherein the transmission and reception module and the sensor module transmit or receive a signal in a non-contact manner.

SUMMARY

However, in the substrate processing apparatus, it is required to detect a temperature of a rotatable holder.

For the above problem, in one aspect, one object of the present disclosure is to provide a holder temperature detection method for detecting a temperature of a rotatable holder, a holder monitoring method, and a substrate processing apparatus.

As one example of the present disclosure, a holder temperature detection method which measures a temperature of a rotatable holder that holds a substrate is provided. The method comprises: a step of irradiating a fluorescent body thermally mounted on the holder with a light pulse having a first wavelength; a step of detecting fluorescence having a second wavelength emitted from the fluorescent body due to the light pulse; and a step of estimating the temperature of the holder based on the detected fluorescence.

DETAILED DESCRIPTION

Hereinafter, an embodiment for implementing the present disclosure will be described with reference to the accompanying drawings. —In the specification and drawings, substantially the same constituents are designated by the same reference numerals to omit duplicate explanations.

<Substrate Processing Apparatus>

Figure 1:
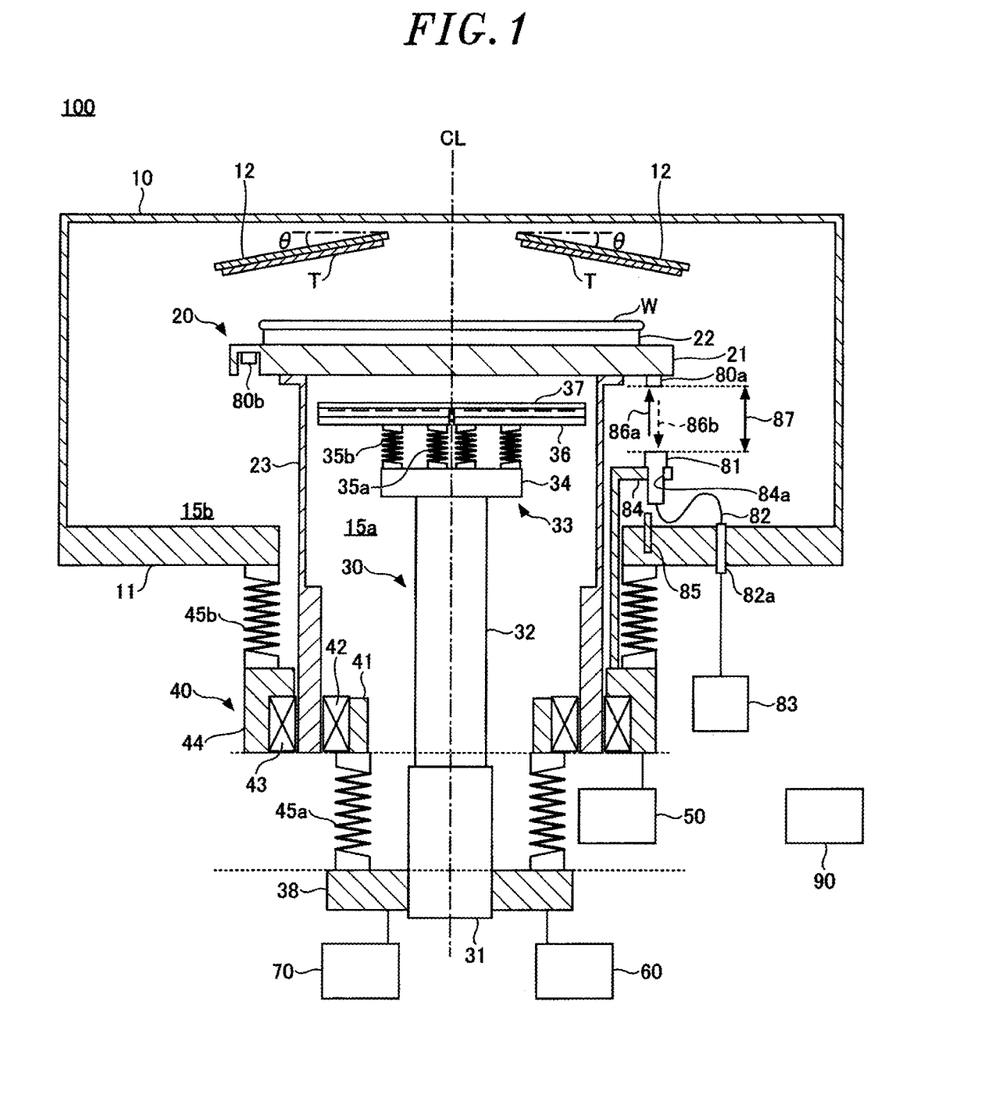
FIG. 1 is a longitudinal cross-sectional view illustrating an example of a substrate processing apparatus according to an embodiment.
Figure 2:
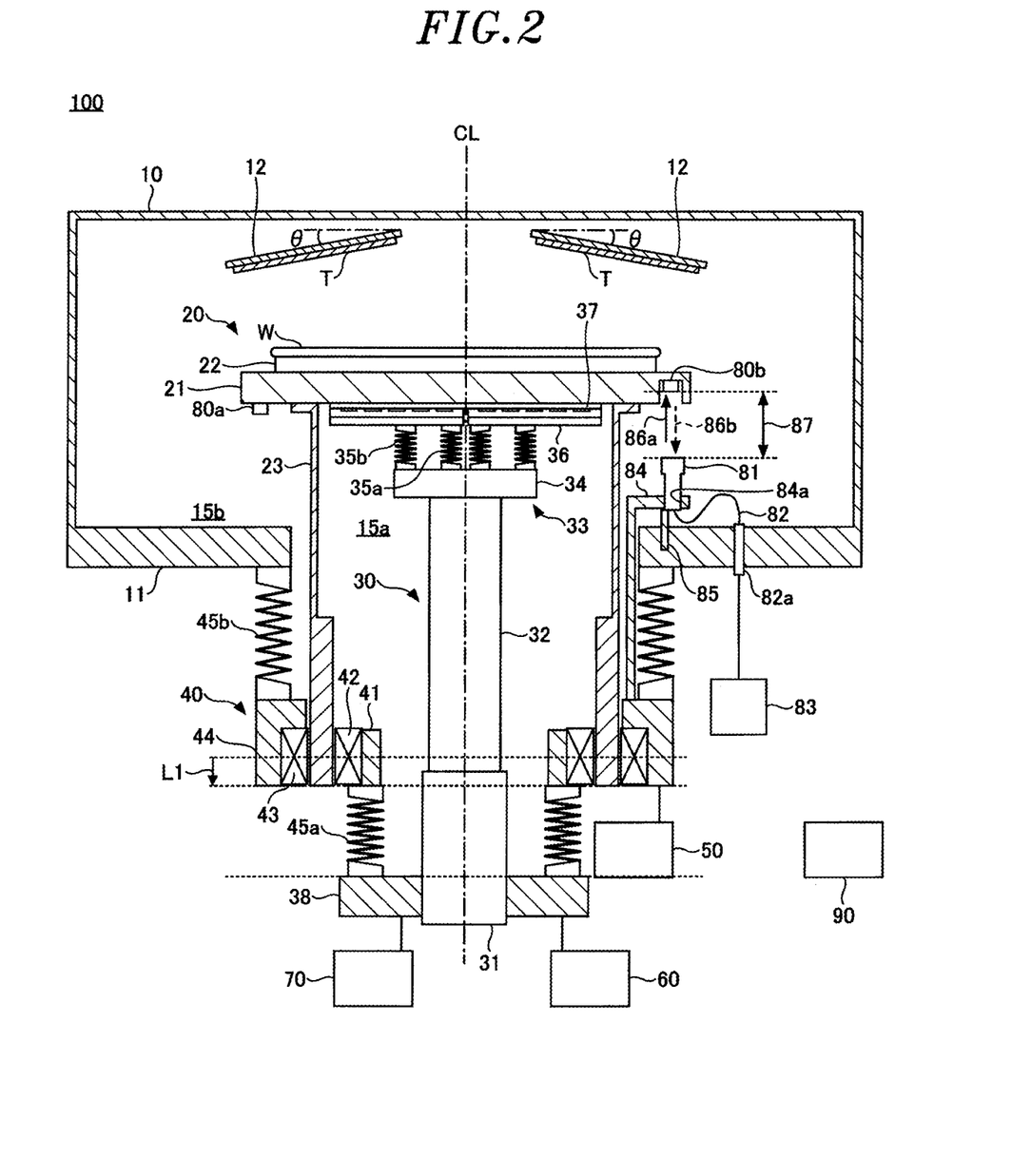
FIG. 2 is a longitudinal cross-sectional view illustrating the example of the substrate processing apparatus according to the present embodiment.

A substrate processing apparatus 100 according to the present embodiment will be described with reference to FIGS. 1 and 2. —FIGS. 1 and 2 are longitudinal cross-sectional views illustrating an example of the substrate processing apparatus 100 according to the present embodiment. —Further, FIG. 1 illustrates a state in which a contact plate 37 of a refrigerating device 30 is separated from a holder 21. —FIG. 2 illustrates a state in which the contact plate 37 of the refrigerating device 30 is in contact with the holder 21.

The substrate processing apparatus 100 illustrated in FIG. 1 is, for example, a physical vaper deposition (PVD) apparatus that forms a film on a substrate W such as a semiconductor wafer to be processed inside a processing container 10 in which an ultra-high vacuum and extremely low temperature atmosphere is formed and the substrate is processed with a processing gas. —Here, the ultra-high vacuum means a pressure atmosphere of, for example, 10-5 Pa or less, and the extremely low temperature means a temperature atmosphere of −30° C. or lower, for example, about −200° C.

The substrate processing apparatus 100 includes the processing container 10, the holder 21 that holds the substrate W inside the processing container 10, the refrigerating device 30, a rotary support 40 that rotatably supports the holder 21, a first elevating device 50 that moves the holder 21 up and down, and a second elevating device 60 that moves the refrigerating device 30 up and down. —The substrate processing apparatus 100 illustrated in FIGS. 1 and 2 has been described as including two elevating devices which are the first elevating device 50 that moves the holder 21 up and down and the second elevating device 60 that moves the refrigerating device 30 up and down, but may have a structure in which the holder 21 and the refrigerating device 30 are moved up and down by a common elevating device.

In the inside of the processing container 10, the holder 21 is disposed at the lower side. —Further, above the holder 21, a plurality of target holders 12 are fixed in a state in which the plurality of target holders 12 have a predetermined inclination angle θ with respect to a horizontal plane. —A target T is mounted on a lower surface of each of the target holders 12. —In FIGS. 1 and 2, the number of target holders 12 may be one or three or more. —Further, a material of the target may differ or be the same for each of the target holders 12.

The processing container 10 is configured so that the inside thereof is depressurized to an ultra-high vacuum by operating an exhaust device (not illustrated) such as a vacuum pump. —Further, a processing gas (for example, a rare gas such as argon (Ar), krypton (Kr), neon (Ne), or a nitrogen (N2) gas) required for sputter film formation is supplied to the processing container 10 via a gas supply pipe (none of which is illustrated) that communicates with a processing gas supply device.

An alternating current (AC) voltage or a direct current (DC) voltage is applied from a plasma generation power supply (not illustrated) to the target holder 12. —When an AC voltage is applied from the plasma generation power supply to the target holder 12 and the target T, plasma is generated inside the processing container 10, the rare gas or the like inside the processing container 10 is ionized, and the target T is sputtered by the ionized rare gas element or the like. —Atoms or molecules of the sputtered target T are deposited on a surface of the substrate W that is held in the holder 21 to face the target T.

Due to the target T being inclined with respect to the substrate W, an incident angle at which sputtered particles sputtered from the target T are incident on the substrate W can be adjusted, and in-plane uniformity of a film thickness of a film formed on the substrate W can be enhanced. —Further, in the inside of the processing container 10, even when each of the target holders 12 is installed at the same inclination angle θ, the incident angle of the sputtered particles on the substrate W can be changed by moving the holder 21 up and down to change a distance between the target T and the substrate W. —Therefore, for each of the applied targets T, the holder 21 is controlled to move up and down and to have a suitable distance with respect to each of the targets T.

The holder 21 is made of a material (for example, Cu) having a high thermal conductivity and is formed to have a disk shape.

An electrostatic chuck (ESC) plate 22 is provided on the side of an upper surface of the holder 21. —The ESC plate 22 has a chuck electrode embedded in a dielectric. —The chuck electrode is configured to have a predetermined potential via wiring. —With such a configuration, the substrate W can be adsorbed by an ESC, and the substrate W can be fixed to the upper surface of the electrostatic chuck plate 22.

A cylindrical stand 23 is provided on the side of a lower surface of the holder 21. The cylindrical stand 23 is made of a material (for example, austenitic stainless steel, ferritic stainless steel, or the like) having a low thermal conductivity and is formed to have a cylindrical shape. —The cylindrical stand 23 supports the holder 21. —Further, the cylindrical stand 23 partitions a space 15a inside the cylindrical stand 23 and a space 15b outside the cylindrical stand 23. —Further, the holder 21, the ESC plate 22, and the cylindrical stand 23 constitute a rotating body 20 that rotates on a rotating axis CL. —The cylindrical stand 23 may have a space that is a lightening hole formed in a cylindrical shape. —Thus, it is possible to further reduce the thermal conductivity of the cylindrical stand 23.

The refrigerating device 30 includes a cold head 31, a cold link 32, and a heat transfer plate assembly 33.

The cold head 31 is supported by a support member 38. —Further, the cold head 31 is cooled by a refrigerator (not illustrated). —From the viewpoint of cooling capacity, the refrigerator preferably uses a Gifford-McMahon (GM) cycle.

The cold link 32 is formed to extend from the cold head 31 toward the holder 21. The cold link 32 is made of a material (for example, Cu) having a high thermal conductivity and thermally connects the cold head 31 to the heat transfer plate assembly 33.

The heat transfer plate assembly 33 has a plate 34, concentric bellows 35a and 35b, a plate 36, and a contact plate 37. —The plate 34 is thermally connected to the cold link 32. The concentric bellows 35a and 35b thermally connect the plate 34 to the plate 36. —The thermally connected contact plate 37 is provided on an upper surface of the plate 36.

With such a configuration, the cold head 31 cools the contact plate 37 of the heat transfer plate assembly 33 to an extremely low temperature via the cold link 32 and the heat transfer plate assembly 33. —Further, the contact plate 37 can be brought into contact with a bottom surface of the holder 21 by moving the support member 38 up or moving the holder 21 down. —Further, the holder 21 and the contact plate 37 can be separated from each other by moving the support member 38 down or moving the holder 21 up.

The rotary support 40 includes an inner ring member 41, a bearing 42, a bearing 43, and an outer ring member 44. —The bearing 42 is disposed between the inner ring member 41 and the cylindrical stand 23. —Further, the bearing 43 is disposed between the outer ring member 44 and the cylindrical stand 23. —With such a configuration, the cylindrical stand 23 is supported rotatably.

Further, the bellows 45a is provided between the inner ring member 41 and the support member 38. —The bellows 45b is provided between the outer ring member 44 and a bottom surface 11. —The bearings 42 and 43 rotatably support the cylindrical stand 23 and seal the cylindrical stand 23 with a magnetic fluid. —Thus, the space 15a in which the refrigerating device 30 is disposed is made airtight by the bearing 42 and the bellows 45a. Further, the space 15b is made airtight by the bearing 43 and the bellows 45b.

Further, the substrate processing apparatus 100 includes a rotary motor (not illustrated) that rotates the cylindrical stand 23. —Thus, the rotary motor can rotate the cylindrical stand 23 to rotate the holder 21.

The first elevating device 50 moves the holder 21 up and down by moving the cylindrical stand 23, the inner ring member 41, and the outer ring member 44 up and down.

The second elevating device 60 moves the contact plate 37 up and down by moving the support member 38 up and down.

The vacuum pump 70 exhausts internal air of the space 15a through an opening (not illustrated) provided in the support member 38.

Further, the substrate processing apparatus 100 includes a temperature detection part that detects the temperature of the rotating holder 21. —The temperature detection part includes fluorescent bodies 80a and 80b, a detection part (one end of an optical waveguide) 81, an optical fiber (an optical waveguide) 82, and a processing unit 83.

The fluorescent bodies 80a and 80b are provided on the surface of the holder 21. For example, the fluorescent bodies 80a and 80b are disposed on the side of the bottom surface in the vicinity of an end portion of the rotating holder 21 to be thermally connected thereto. —Like the fluorescent body 80a, the fluorescent bodies 80a may be disposed on the back surface of the holder 21. —Further, like the fluorescent body 80b, a recessed portion may be formed in the back surface of the holder 21, and the fluorescent bodies 80b may be disposed inside the recessed portion. —Further, the fluorescent bodies 80a and 80b may be formed on metal pellets having a high thermal conductivity such as Cu and Al, and the metal pellets having the fluorescent bodies may be mounted on the holder 21. —Further, a plurality of fluorescent bodies 80a and 80b may be disposed in a circumferential direction of the holder 21.

The fluorescent bodies 80a and 80b are excited when irradiated with light of a first wavelength, emit light (fluorescence) having a second wavelength different from the first wavelength and transition to the ground state. —As the fluorescent bodies 80a and 80b, for example, YAG or the like can be used.

The processing unit 83 includes a light source (not illustrated) that is provided outside the processing container 10 to irradiate pulsed light of the first wavelength, and a detector (not illustrated) that detects light of the second wavelength. —One end of the optical fiber (optical waveguide) 82 is connected to the detection part 81 in the processing container 10, and the other end is connected to the processing unit 83 (a light source, a detector) via a fitting 82a passing through the bottom surface 11 of the processing container 10. —With such a configuration, the light source of the processing unit 83 irradiates light 86a from the detection part 81 via the optical fiber 82. —Further, the light 86b incident on the detection part 81 is guided to the detector of the processing unit 83 via the optical fiber 82.

Further, the temperature detection part includes a position adjusting part that adjusts the position of the detection part 81. —In the example illustrated in FIGS. 1 and 2, the position adjusting part includes a support member 84 and a contact member 85. —The support member 84 stands from the outer ring member 44 and supports the detection part 81 to be movable in a vertical direction. —Specifically, the detection part 81 is inserted into a hole 84a provided in the support member 84, and the detection part 81 is supported to be movable in the vertical direction. —The contact member 85 stands from the bottom surface 11 of the processing container 10. Thus, in a state illustrated in FIG. 1, an enlarged diameter portion of the detection part 81 is engaged with an edge of the hole 84a, and thus a distance 87 from the fluorescent body 80a to the detection part 81 is maintained. —On the other hand, in a state illustrated in FIG. 2, a bottom portion of the detection part 81 is engaged with the contact member 85, thus the detection part 81 is pushed up from the hole 84a, and the distance 87 from the fluorescent body 80b to the detection part 81 is maintained. —In this way, the position adjusting part can constantly maintain the distance 87 from the fluorescent bodies 80a and 80b to the detection part 81 by adjusting a position of the detection part 81. —The distance 87 is preferably 1 mm or more and 50 mm or less, and more preferably 5 mm or more and 20 mm or less.

Further, the substrate processing apparatus 100 includes a controller 90 that controls the entire substrate processing apparatus 100. —A temperature of the holder 21 detected by the temperature detection part (the processing unit 83) is input to the controller 90. —Further, the controller 90 controls a rotary motor (not illustrated) that rotates the cylindrical stand 23, the first elevating device 50, the second elevating device 60, and the like.

<Holder Temperature Detection Method>

First, the temperature detection of the holder 21 when the holder 21 is rotating will be described with reference to FIG. 1. —In a deposition process in which sputtered particles are deposited on the substrate W, as illustrated in FIG. 1, the holder 21 is separated from the contact plate 37, and the holder 21 rotates. —As the holder 21 rotates, the fluorescent body 80a also rotates.

At the timing when the rotating holder 21 reaches a predetermined angle and the fluorescent body 80a and the detection part 81 are aligned (in other words, the timing when the fluorescent body 80a reaches a radiation direction and a detection direction of the detection part 81), the processing unit 83 irradiates the fluorescent body 80a with the pulsed light having the first wavelength. —Then, the processing unit 83 detects the fluorescence having the second wavelength from the fluorescent body 80a. —Then, the processing unit 83 estimates the temperature of the holder 21 based on the detected fluorescence.

Here, the fluorescent body 80a to which the pulsed light of the first wavelength is irradiated emits the fluorescence having the second wavelength while attenuating the intensity thereof. —The intensity attenuation of the fluorescence emitted by the fluorescent body 80a depends on the temperature of the fluorescent body 80a (in other words, the temperature of the holder 21). —The processing unit 83 calculates an attenuation time constant based on the intensity attenuation of the detected fluorescence. —Further, the processing unit 83 stores, in advance, a table in which the attenuation time constant and the temperature of the holder 21 are associated with each other. —The processing unit 83 estimates (detects) the temperature of the holder 21 based on the table and the calculated attenuation time constant.

As the fluorescent body 80a, it is preferable to use a material in which the intensity of the fluorescence is attenuated in a short time (for example, 1 to 10 ms) at an extremely low temperature. —As a result, a detection time can be shortened. —Further, it is possible to suppress a change in a length of an optical path from the fluorescent body 80a to the detection part 81 due to movement of the fluorescent body 80a (rotation of the holder 21). —The intensity of the detected fluorescence may be corrected based on a relationship between the position and the angle of the fluorescent body 80a and the detection part 81.

Further, the temperature of the holder 21 can be periodically detected according to a rotation speed of the holder 21 and the number of the fluorescent bodies 80a by providing a plurality of fluorescent bodies 80a in the circumferential direction.

Further, a plurality of detection parts 81 may be provided in an arc shape centered on the rotation axis CL. —Thus, even in a configuration in which the rotation speed of the holder 21 is high or a configuration in which a fluorescent body 80a having a long attenuation time of the intensity of the fluorescence is used, the temperature of the holder 21 can be suitably detected.

Further, the example in which the processing unit 83 estimates the temperature based on the temperature dependence of the fluorescence intensity attenuation has been described, but the present disclosure is not limited thereto. —The temperature of the holder 21 may be estimated based on temperature dependence of other optical characteristics of the fluorescence (for example, a band edge of Si and the like).

Next, the temperature detection of the holder 21 at the time of cooling the holder 21 will be described with reference to FIG. 2. —In a cooling process, the holder 21 descends by a distance L1 so that a rotation angle of the holder 21 is an angle at which the fluorescent body 80b and the detection part 81 are aligned with each other. —Thus, as illustrated in FIG. 2, the holder 21 comes into contact with the contact plate 37 and is cooled.

The processing unit 83 irradiates the fluorescent body 80b with the pulsed light having the first wavelength. —Then, the processing unit 83 detects the fluorescence having the second wavelength from the fluorescent body 80b. —Then, the processing unit 83 estimates the temperature of the holder 21 based on the detected fluorescence.

Here, the fluorescent body 80b is disposed in the recessed portion of the holder 21. As a result, the temperature of the holder 21 can be measured at a position closer to the substrate W. —Therefore, when the temperature of the substrate W is estimated based on the detected temperature of the holder 21, the estimation accuracy can be enhanced.

Further, the distance 87 from the fluorescent body 80b illustrated in FIG. 2 to the detection part 81 is maintained at the distance 87 from the fluorescent body 80a illustrated in FIG. 1 to the detection part 81 by the position adjusting part (the support member 84 and the contact member 85). —Thus, an effect of the intensity attenuation according to the length of the optical path from the fluorescent bodies 80a and 80b to the detection part 81 can be made uniform. —Therefore, even in the state of FIG. 2, the temperature of the holder 21 can be detected in the same manner as in the state of FIG. 1.

As described above, according to the substrate processing apparatus 100 of the present embodiment, the temperature of the holder 21 can be detected using the temperature detection part (the fluorescent bodies 80a and 80b, the detection part 81, the optical fiber 82, and the processing unit 83).

Incidentally, as a method of measuring a temperature of a rotating body, a configuration in which an element for measuring the temperature is provided in the rotating body, and the temperature is measured from the outside through a conductive ring and a slip ring having a sliding contact point is known. —However, in the substrate processing apparatus 100 according to the present embodiment, it is difficult to apply the slip ring because a diameter of the rotating body 20 is large. —Further, since the holder 21 is cooled to an extremely low temperature, it is difficult to measure the temperature of the holder 21 using a pyrometer.

On the other hand, the temperature detection part of the present embodiment can detect the temperature of the holder 21 by maintaining the fluorescent bodies 80a and 80b provided on the rotating holder 21 and the detection part 81 in a non-contact manner. Further, the temperature detection part of the present embodiment can detect the temperature of the holder 21 which is cooled to an extremely low temperature.

<Holder Monitoring>

Figure 3:
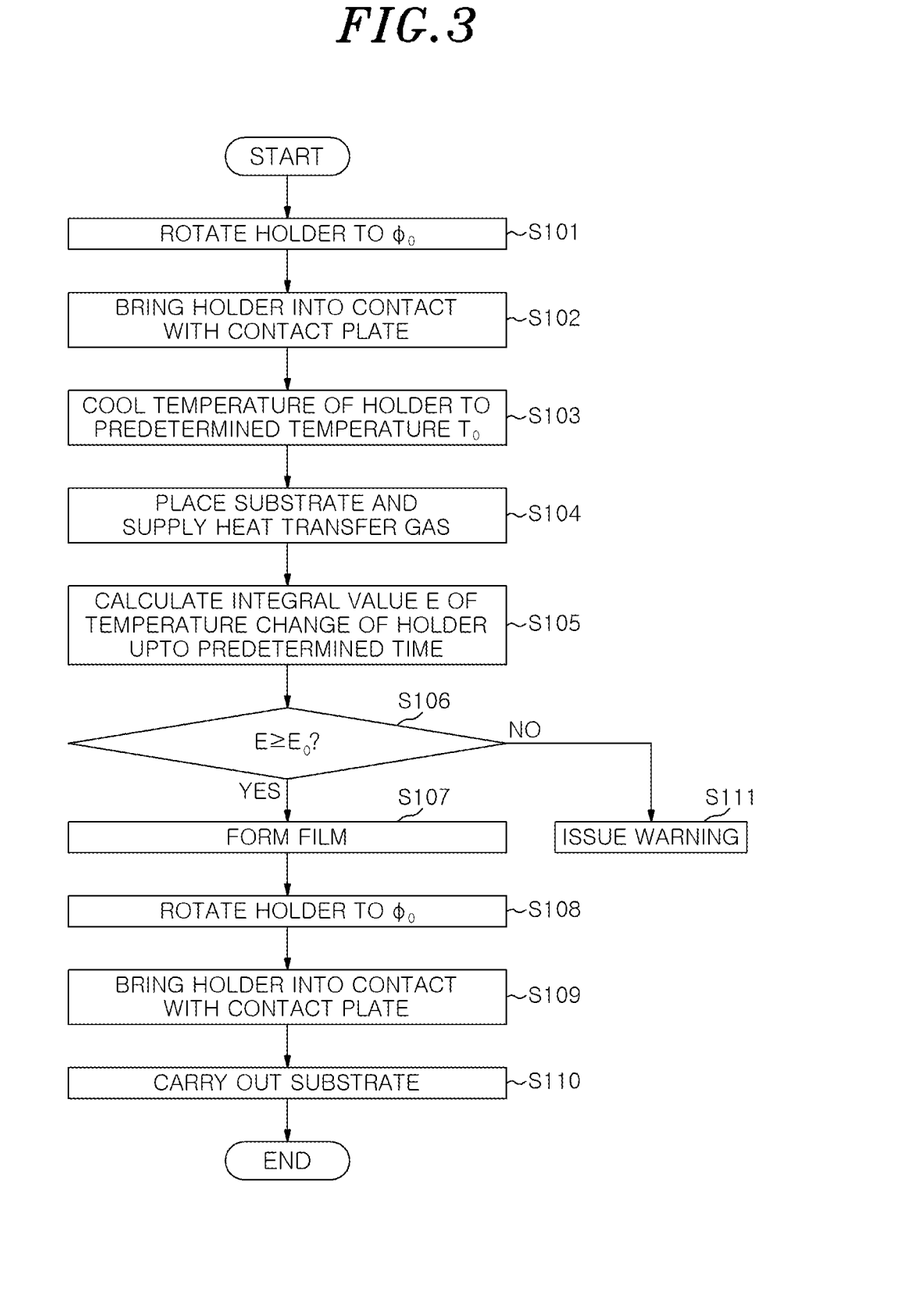
FIG. 3 is an example of a flowchart describing a holder monitoring method.

Next, monitoring of the holder 21 will be described with reference to FIG. 3. —FIG. 3 is an example of a flowchart illustrating a method of monitoring the holder 21. —Here, a case in which the controller 90 monitors a heat transfer state between the holder 21 and the substrate W and performs a film forming process will be described as an example.

In Step S101, the holder 21 is rotated to a rotation angle of $\varphi 0$. —Here, the substrate processing apparatus 100 has an encoder (not illustrated) that detects the rotation angle of the holder 21. —A detection angle obtained by the encoder is input to the controller 90. —The controller 90 controls a rotary motor (not illustrated) to rotate the holder 21 to the rotation angle of $\varphi 0$. —The rotation angle of $\varphi 0$ is the rotation angle of the holder 21 at which the fluorescent body 80b is aligned with the detection part 81.

In Step S102, the contact plate 37 is brought into contact with the holder 21. —Here, the controller 90 controls the first elevating device 50 to move the holder 21 down. —As a result, the state of the substrate processing apparatus 100 becomes the state illustrated in FIG. 2.

In Step S103, the temperature of the holder 21 is lowered to a predetermined temperature T0 by cooling. —The cooling of the holder 21 is started by thermally connecting the cold head 31 and the holder 21 to each other via the cold link 32 and the heat transfer plate assembly 33. —Here, the processing unit 83 irradiates the fluorescent body 80b with pulsed light and measures (estimates) the temperature of the holder 21 based on the detected fluorescence of the fluorescent body 80b. —When the temperature of the holder 21 becomes lower than or equal to the predetermined temperature T0, the process of the controller 90 proceeds to Step S104.

In Step S104, the substrate W is placed, and a heat transfer gas is supplied. —A high-temperature substrate W is placed on a mounting surface of the holder 21 by a transport device (not illustrated). —The controller 90 controls a power supply (not illustrated) that applies electric power to the electrode of the ESC plate 22 to cause the ESC plate 22 to adsorb/attract the substrate W. —Further, the controller 90 controls a heat transfer gas supply (not illustrated) to supply the heat transfer gas (for example, He gas) between a back surface of the substrate W and an upper surface of the ESC plate 22. —The upper surface of the ESC plate 22 has a concave portion and a convex portion that comes in contact with a bottom surface of the concave portion, and the upper surface of the convex portion is in contact with the back surface of the substrate W. —The heat transfer gas is supplied to a space formed by the back surface of the substrate W and the concave portion.

In Step S105, an integral value E of the temperature change of the holder 21 from the placement of the substrate W to a predetermined time is calculated. —Here, the processing unit 83 irradiates the fluorescent body 80b with pulsed light and detects the temperature of the holder 21 based on the detected fluorescence of the fluorescent body 80b. —Further, the processing unit 83 acquires a time change T (t) of the temperature of the holder 21 by repeating the temperature measurement in a predetermined cycle. —The controller 90 calculates the integral value E (=(T(t)−T0)Δt) based on the time change T(t) of the temperature of the holder 21, the initial temperature T0, and a duration Δt. —The integral value E is a value that depends on a heat transfer state between the holder 21 and the substrate W. —When the heat transfer state between the holder 21 and the substrate W is degraded, the integral value E becomes smaller.

In Step S106, the controller 90 determines whether or not the integral value E is greater than or equal to a threshold value E0. —When the integral value E is greater than or equal to the threshold value E0 (S106: Yes), the process of the controller 90 proceeds to Step S107. —When the integral value E is not greater than or equal to the threshold value E0 (S106: No), the process of the controller 90 proceeds to Step S111.

In Step S107, the controller 90 performs the film forming process. —The controller 90 controls the first elevating device 50 to move the holder 21 up. —Then, the controller 90 controls the rotary motor (not illustrated) to rotate the holder 21. —As a result, the state of the substrate processing apparatus 100 becomes the state illustrated in FIG. 1. —Then, the sputtered particles are emitted from the target T to form a film on the substrate W. —The processing unit 83 irradiates the pulsed light at the timing when the fluorescent body 80a rotating together with the holder 21 is disposed on the detection part 81, and measures (estimates) the temperature of the holder 21 based on the detected fluorescence of the fluorescent body 80a.

In Step S108, the holder 21 is rotated to the rotation angle of $\varphi 0$. —Here, the substrate processing apparatus 100 has an encoder (not illustrated) that detects the rotation angle of the holder 21. The detection angle of the encoder is input to the controller 90. The controller 90 controls the rotary motor (not illustrated) to rotate the holder 21 to the rotation angle of φ0. The rotation angle of φ0 is the rotation angle of the holder 21 at which the fluorescent body 80b is aligned with the detection part 81.

In Step S109, the contact plate 37 is brought into contact with the holder 21. Here, the controller 90 controls the first elevating device 50 to move the holder 21 down. As a result, the state of the substrate processing apparatus 100 becomes the state illustrated in FIG. 2.

In Step S110, the substrate W is carried out. The controller 90 controls a power supply (not illustrated) that applies electric power to the electrode of the ESC plate 22 to release the adsorption of the substrate W by the ESC plate 22. Then, the substrate W is carried out of the mounting surface of the holder 21 by a transport device (not illustrated).

When a subsequent substrate W is carried into the substrate processing apparatus 100, the processing of the controller 90 repeats Steps S104 to S110.

Further, in Step S106, when the integral value E is not greater than or equal to the threshold value E0 (S106: No), the process of the controller 90 proceeds to Step S111. In Step S111, the controller 90 issues a warning.

Here, a simulation of the temperature change when the high-temperature substrate W is placed on the holder 21 will be described with reference to FIGS. 4 to 8.

Figure 4:
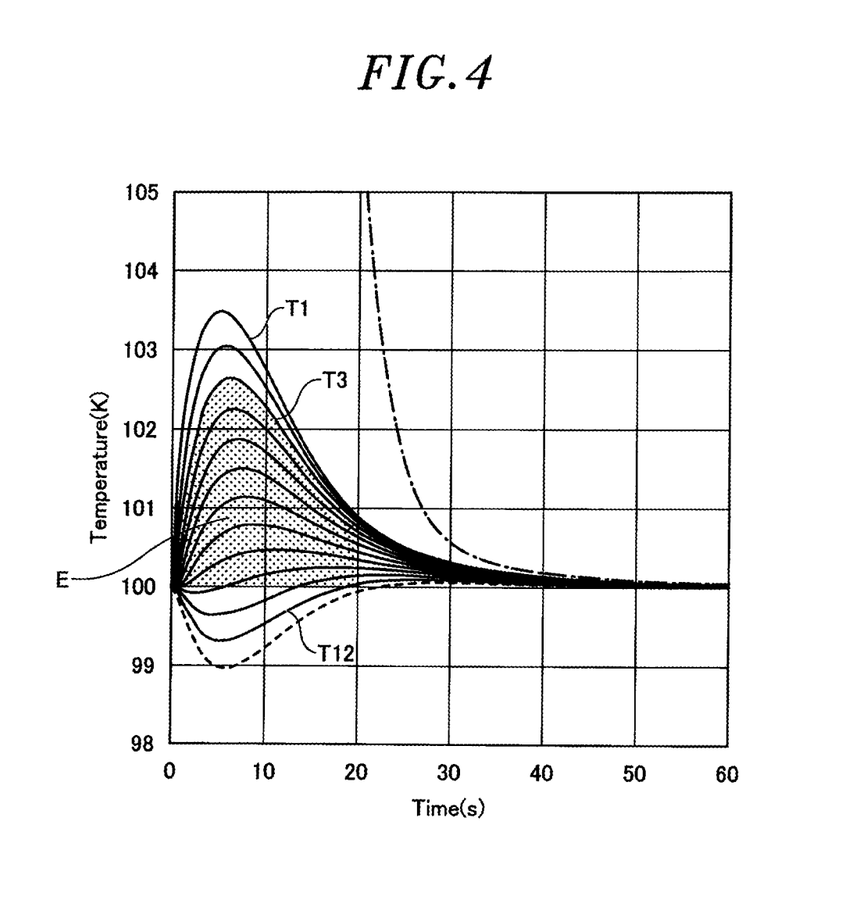
FIG. 4 is an example of a graph illustrating a change in temperature when a thermal conductivity between a holder and a substrate is a reference value.
Figure 5:
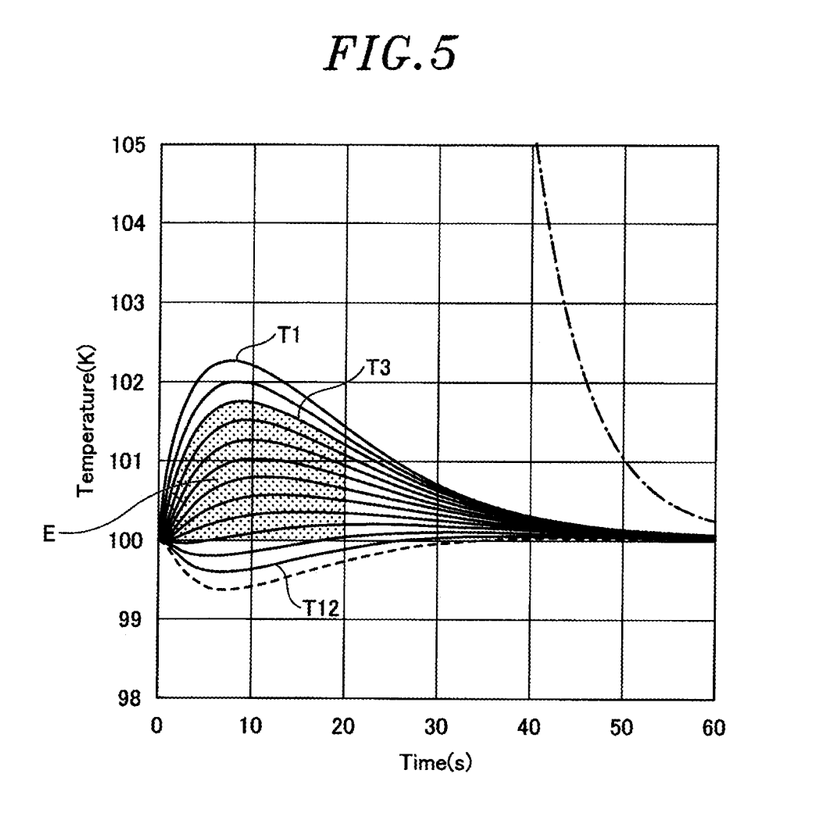
FIG. 5 is an example of a graph illustrating the change in temperature when the thermal conductivity between the holder and the substrate is 50% of a reference value.

FIG. 4 is an example of a graph illustrating the temperature change when the thermal conductivity between the holder 21 and the substrate W is a reference value. FIG. 5 is an example of a graph illustrating the temperature change when the thermal conductivity between the holder 21 and the substrate W is 50% of the reference value.

In FIGS. 4 and 5, a vertical axis represents a temperature (K), and a horizontal axis represents a time. Further, in the time on the horizontal axis, the time when the substrate W is brought into contact with the holder 21 is set to zero. A broken line indicates the temperature of the cold head 31. An alternate long and short dash line indicates the temperature of the substrate W. Temperature curves T1 to T12 illustrated by solid lines indicate a temperature of each slice in which the holder 21 is sliced at predetermined intervals in a plate thickness direction. T1 is the temperature curve in the slice on the front surface side, and T12 is the temperature curve in the slice on the back surface side. Further, the temperature T0 of the holder 21 and the cold head 31 before the substrate W is mounted is set to 100K. Further, in the reference value of the thermal conductivity in FIG. 4, a pressure of the heat transfer gas (He gas) filling a space between the ESC plate 22 and the substrate W is set to 6 Torr.

When the high-temperature substrate W is placed on the holder 21, the temperature curve T1 of the slice closer to the substrate W shows the highest temperature increase than the temperature of the other slices. Further, the temperature curve T12 of the slice in contact with the contact plate 37 is cooled to 100 K or less according to a heat load of the substrate W.

Figure 6:
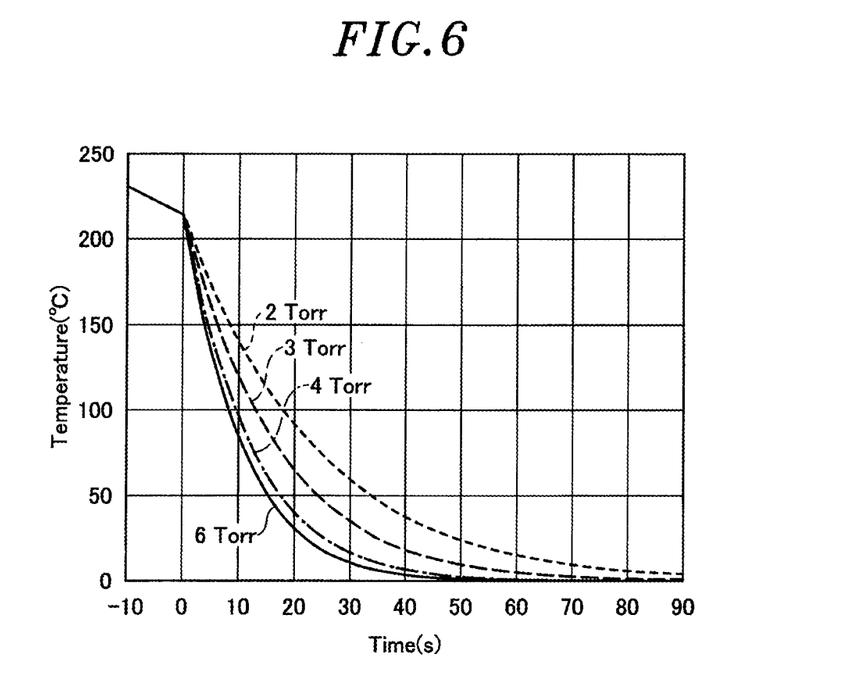
FIG. 6 is an example of a graph illustrating a change in temperature of the substrate.

FIG. 6 is an example of a graph illustrating the temperature change of the substrate W.

In FIG. 6, a vertical axis represents a temperature (K) and a horizontal axis represents a time. Further, in the time on the horizontal axis, the time when the substrate W is brought into contact with the holder 21 is set to zero. A temperature drop of the substrate W before being in contact with the holder 21 is due to heat dissipation caused by radiant heat. Further, the pressure of the heat transfer gas (the He gas) filling the space between the ESC plate 22 and the substrate W is 2 Torr, 3 Torr, 4 Torr, or 6 Torr.

As illustrated in FIG. 6, the cooling efficiency of the substrate W is improved according to the pressure of the heat transfer gas. Further, the time required for cooling the substrate W becomes shorter as the pressure of the heat transfer gas increases.

Figure 7:
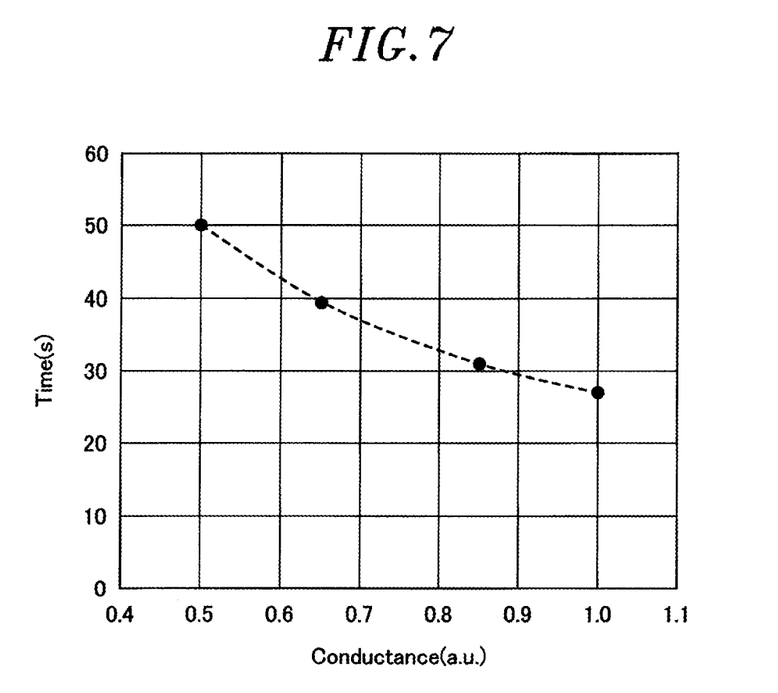
FIG. 7 is an example of a graph illustrating an estimated time required to cool the substrate.

FIG. 7 is an example of a graph illustrating the estimated time required to cool the substrate W.

In FIG. 7, a vertical axis represents the estimated time required to cool the substrate W from 498K to 101 K, and a horizontal axis represents the thermal conductivity between the holder 21 and the substrate W. The horizontal axis is normalized with the thermal conductivity at the reference value as 1.

The thermal conductivity between the holder 21 and the substrate W depends on the pressure of the heat transfer gas (refer to FIG. 6) and contact conditions between the convex portion of the ESC plate 22 and the back surface of the substrate W. For example, when a mounting position of the substrate W is displaced or particles are present between the ESC plate 22 and the substrate W, the cooling efficiency is affected. In this case, in the film forming process (Step S107), the sputtered particles may be deposited at a temperature higher than a design temperature.

Here, it is difficult to directly measure the temperature of the substrate W. The controller 90 detects the temperature of the holder 21 and estimates the thermal conductivity between the holder 21 and the substrate W. Then, it is possible to confirm whether the substrate W is appropriately positioned and whether the substrate W and the holder 21 are appropriately in thermal contact with each other by estimating the thermal conductivity.

Here, as illustrated in comparison with FIGS. 4 and 5, the temperature of the slice of the holder 21 close to a contact surface with the substrate W rises at a different rate according to a gas conductance and a conductance between the substrate W and the holder 21.

Further, the sum of products of the temperature rise of the holder 21 and the time (the integral value E in Step S105) is proportional to energy required to cool the substrate W. This corresponds to an area surrounded by the temperature curve and the temperature T0. As an example, in FIGS. 4 and 5, the integral value E of the temperature change up to a predetermined time (for example, 20 seconds) on the temperature curve T3 is shaded. Then, the temperature of each of the slices of the holder finally converges to 100K by the refrigerating device 30.

Figure 8:
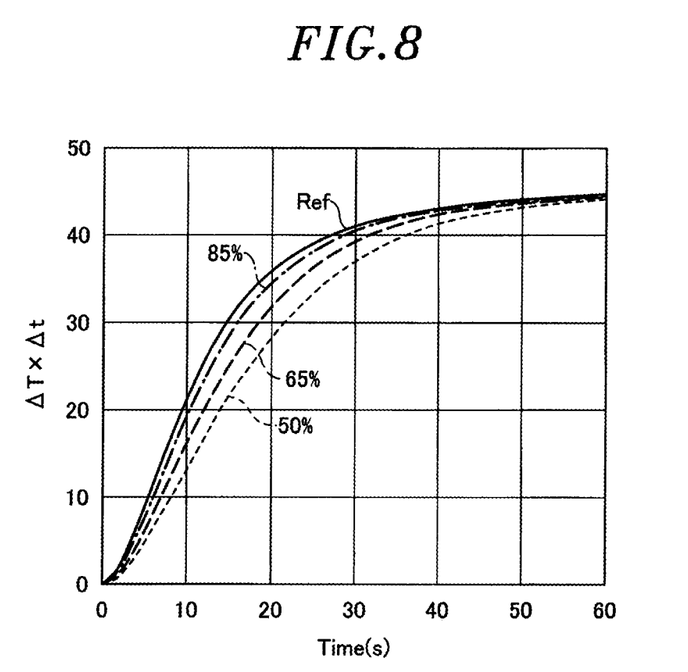
FIG. 8 is an example of a graph illustrating an increase in an integral value.

FIG. 8 is an example of a graph illustrating an increase in the integral value E. In FIG. 8, a vertical axis represents ΔT×Δt(=the integral value E), and a horizontal axis represents a time. Further, a case in which the thermal conductivity is the reference value (Ref), or 85%, 65%, and 50% with respect to the reference value is illustrated.

A curve converges around 60 seconds, but a difference in the thermal conductivity can be distinguished in a shorter time. That is, the temperature of the holder 21 is recorded over time, and the integral value E is evaluated in a short time (for example, 20 seconds) (refer to Step S106). Thus, the thermal conductivity between the substrate W and the holder 21 can be evaluated without directly measuring the temperature of the substrate W.

Further, due to the fluorescent body 80b being provided in the recessed portion (in the examples of FIGS. 4 and 5, for example, in the slice of the temperature curve T3), the temperature detection position can be brought closer to the mounting surface of the holder 21, which is preferable.

—Thus, the temperature rise after the high-temperature substrate W is placed on the holder 21 can be increased, and a change in the integral value E due to the change in the thermal conductivity also becomes large. —As a result, it is possible to enhance evaluation accuracy of the thermal conductivity between the substrate W and the holder 21.

Further, when the integral value E calculated in Step S105 is not higher than or equal to the threshold value E0 (S106: No), an alarm can be issued assuming that the thermal conductivity between the substrate W and the holder 21 is poor (refer to Step S111). —Thus, in the film forming process (Step S107), it is possible to prevent the sputtered particles from being deposited at a temperature higher than the design temperature.

Although the substrate processing apparatus has been described above according to the embodiment, the substrate processing apparatus according to the present disclosure is not limited to the above embodiment, and various modifications and improvements can be made within the scope of the present disclosure. —The matters described in the above-described plurality of embodiments can be combined within a consistent range.

What is claimed is:

1. A holder temperature detection method which measures a temperature of a rotatable holder that holds a substrate, the method comprising:
   irradiating a fluorescent body thermally mounted on the rotatable holder with a light pulse having a first wavelength;
   detecting fluorescence having a second wavelength emitted from the fluorescent body due to the light pulse; and
   estimating the temperature of the rotatable holder based on the detected fluorescence,
   wherein an optical waveguide of which one end is disposed to be spaced apart from the fluorescent body and another end is connected to a light source that radiates the light pulse having the first wavelength and a detector that detects the fluorescence having the second wavelength is provided,
   the fluorescent body includes a first fluorescent body thermally mounted on a first surface of the rotatable holder opposite to a mounting surface that holds the substrate, and a second fluorescent body thermally mounted on a second surface of the rotatable holder opposite to the mounting surface, the second surface being an inner surface of a recessed portion formed in the rotatable holder such that the second fluorescent body is disposed within the recessed portion, the second surface being closer to the mounting surface than the first surface, and
   a position adjusting part which moves the one end of the optical waveguide so that a distance from the one end of the optical waveguide to the second fluorescent body becomes a distance from the one end of the optical waveguide to the first fluorescent body is provided.

2. The holder temperature detection method of claim 1, wherein the step of estimating the temperature of the rotatable holder estimates the temperature of the rotatable holder based on intensity attenuation of the fluorescence.

3. The holder temperature detection method of claim 2, wherein the step of estimating the temperature of the rotatable holder calculates an attenuation time constant based on the intensity attenuation of the fluorescence and estimates the temperature of the rotatable holder based on the calculated attenuation time constant and a table in which the attenuation time constant and the temperature of the rotatable holder are associated with each other.

4. The holder temperature detection method of claim 1, wherein a distance from the one end of the optical waveguide to the fluorescent body is 1 mm or more and 50 mm or less.

5. The holder temperature detection method of claim 1, wherein the rotatable holder is rotated, and the light pulse is radiated at a timing when the fluorescent body and the one end of the optical waveguide are aligned with each other, and the fluorescence is detected.

6. The holder temperature detection method of claim 4, wherein the rotatable holder is rotated, and the light pulse is radiated at a timing when the fluorescent body and the one end of the optical waveguide are aligned with each other, and the fluorescence is detected.

7. A holder monitoring method which monitors a holder that holds a substrate, the method comprising:
   placing the substrate on the holder and introducing a heat exchange gas between the holder and the substrate;
   detecting a temperature of the holder and calculating an integral value of a temperature change of the holder up to a predetermined time; and
   evaluating a thermal conductivity between the holder and the substrate based on the integral value,
   wherein the step of detecting a temperature of the holder comprises:
   irradiating a fluorescent body thermally mounted on the holder with a light pulse having a first wavelength;
   detecting fluorescence having a second wavelength emitted from the fluorescent body due to the light pulse; and
   estimating the temperature of the holder based on the detected fluorescence,
   wherein an optical waveguide of which one end is disposed to be spaced apart from the fluorescent body and another end is connected to a light source that radiates the light pulse having the first wavelength and a detector that detects the fluorescence having the second wavelength is provided,
   the fluorescent body includes a first fluorescent body thermally mounted on a first surface of the holder opposite to a mounting surface that holds the substrate, and a second fluorescent body thermally mounted on a second surface of the holder opposite to the mounting surface, the second surface being an inner surface of a recessed portion formed in the rotatable holder such that the second fluorescent body is disposed within the recessed portion, the second surface being closer to the mounting surface than the first surface, and
   a position adjusting part which moves the one end of the optical waveguide so that a distance from the one end of the optical waveguide to the second fluorescent body becomes a distance from the one end of the optical waveguide to the first fluorescent body is provided.

8. The holder monitoring method of claim 7, wherein an alarm is issued based on the evaluation.

9. A substrate processing apparatus comprising:
   a rotatable holder configured to hold a substrate;
   a fluorescent body thermally mounted on the rotatable holder;
   a light source configured to irradiate the fluorescent body with a light pulse having a first wavelength;
   a detector configured to detect fluorescence having a second wavelength emitted from the fluorescent body due to the light pulse;

a temperature detection part configured to estimate a temperature of the rotatable holder based on the detected fluorescence; and an optical waveguide of which one end is disposed to be spaced apart from the fluorescent body and another end is connected to the light source and the detector, wherein the fluorescent body includes a first fluorescent body thermally mounted on a first surface of the rotatable holder opposite to a mounting surface that holds the substrate, and a second fluorescent body thermally mounted on a second surface of the rotatable holder opposite to the mounting surface, the second surface being an inner surface of a recessed portion formed in the rotatable holder such that the second fluorescent body is disposed within the recessed portion, the second surface being closer to the mounting surface than the first surface, and the substrate processing apparatus further comprises a position adjusting part which moves the one end of the optical waveguide so that a distance from the one end of the optical waveguide to the second fluorescent body becomes a distance from the one end of the optical waveguide to the first fluorescent body.

* * * * *